(12) United States Patent
Chu et al.

(10) Patent No.: US 6,258,692 B1
(45) Date of Patent: Jul. 10, 2001

(54) METHOD FORMING SHALLOW TRENCH ISOLATION

(75) Inventors: Chih-Hsun Chu, Hsinchu; Hong-Tsz Pan, Hsinchu Hsien; Ming-Tzong Yang, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/235,262

(22) Filed: Jan. 22, 1999

(30) Foreign Application Priority Data

Oct. 30, 1998 (TW) ................................. 87118024

(51) Int. Cl.[7] ........................................... H01L 21/76
(52) U.S. Cl. ........................ 438/400; 438/426; 438/437
(58) Field of Search ..................................... 438/134, 222, 438/296, 400, 424, 437, 445, 702

(56) References Cited

U.S. PATENT DOCUMENTS 6,020,230 * 2/2000 Wu ....................................... 438/222
6,074,927 * 6/2000 Kepler et al. ......................... 438/400
6,180,493 * 1/2001 Chu ...................................... 438/437

* cited by examiner

Primary Examiner—David Nelms
Assistant Examiner—Phuc T. Dang
(74) Attorney, Agent, or Firm—Jiawei Huang; J.C. Patents

(57) ABSTRACT

The invention provides a method of forming shallow trench isolation. In the method, a first mask and a second mask layer are made of polysilicon and silicon oxide, respectively. Part of the first mask layer is oxidized into a protective oxide layer during thermal oxidation for forming a liner oxide layer. The protective oxide layer can protect the top corner of a trench from he formation of pits during subsequent etching for removing a pad oxide layer, thereby preventing a kink effect. Furthermore, after forming the liner oxide layer and before filling the trench with an insulting layer, a buffer layer formed over a substrate not only prevents the sidewalls of the trench from oxidizing, but also prevents a lateral etching damage during subsequent etching for removing the pad oxide layer.

26 Claims, 4 Drawing Sheets

METHOD FORMING SHALLOW TRENCH ISOLATION

CROSS-REFERENCE TO RELATED APPLICATION

This application claims priority benefit of Taiwan application serial no. 87118024, filed Oct. 30, 1998, the full disclosure of which is incorporated herein by reference.

BACKGROUND OF THE INVENTION

1. Field of the Invention

The invention relates to a semiconductor manufacturing method, and in particular to a method of forming shallow trench isolation (STI).

2. Description of the Related Art

Device isolation regions are used to prevent carriers from flowing between any two adjacent devices. Typically, the device isolation regions are formed between field effect transistors (FETs) in integrated circuit (IC) to reduce current leakage created therebetween. Traditionally, the device isolation regions are formed by LOCOS. Since LOCOS technique has increasingly matured, device isolation regions with a high reliability and efficiency can be formed with a low cost. However, the device isolation regions formed by LOCOS have the disadvantages of stress, a bird's beak surrounding each isolation region and thickness variation in different width areas. In particular, the bird's beak prevents the close packing of each device in high-density ICs. Therefore, in high-density ICs, it is necessary to use a shallow trench isolation structure that can be easily reduced in size instead of the traditional isolation structure.

In a method of forming shallow trench isolation, trenches are first formed in a substrate by anisotropic etching and then completely filled by oxide. Since the size of the formed shallow trench isolation regions can be reduced, bird's bread encroachment caused by LOCOS can be prevented. Therefore, it is an ideal isolation method suitable for manufacturing CMOS in sub-micron processes.

FIGS. 1A to 1E are schematic, cross-sectional views showing a method of forming shallow trench isolation according to the prior art.

Referring to FIG. 1A, a pad oxide layer 102 is first formed on a substrate 100 by thermal oxidation, wherein the pad oxide layer 102 is used to protect the surface of the substrate 100. A silicon nitride layer 104 is formed on the pad oxide layer 102 by low pressure chemical vapor deposition (LPCVD).

Referring to FIG. 1B, a photoresist layer (not shown) is formed on the silicon nitride layer 104 by photolithography and etching. The silicon nitride layer 104, the pad oxide layer 102 and the substrate 100 are etched in sequence to form a patterned silicon nitride 104a and a patterned pad oxide layer 102a with trenches 106, 108 formed in the substrate 100. Afterwards, the photoresist layer is removed.

Referring to FIG. 1C, a liner layer 110 is formed on the surfaces of the trenches 106, 108 by high-temperature thermal oxidation, wherein the liner layer 110 extends to the top corners 120 of the trenches 106, 108 to contact the patterned pad oxide layer 102a. An insulating layer 116, such as s silicone oxide layer, is formed over the substrate 100, and completely fills the trenches 106, 108 by atmospheric pressure chemical vapor deposition (APCVD). Next, densification is performed on the insulating layer 116 in a nitrogen environment at a high temperature.

Referring to FIG. 1D, part of the insulation layer 116 is removed by chemical mechanical polishing using the patterned silicon nitride layer 104a as a polishing stop layer.

Referring to FIG. 1E, the patterned silicon nitride layer 104a is removed by wet etching with a hot phosphoric acid solution to expose the patterned pad oxide layer 102a. Then, the patterned pad oxide layer 102a is removed by wet etching using a hydrofluoric acid (HF) solution, thereby forming isolation regions 118a, 118b.

However, the trenches 106, 108 having various densities and areas can affect the uniformity of chemical mechanical polishing. Furthermore, over-polishing is required to ensure that no insulating residue remains on the patterned silicon nitride layer 104a, causing a dish 130 to form in an isolation region 116b, called a dishing effect, as shown in FIG. 1D.

Additionally, to prevent the sidewalls of the trenches 106, 108 from oxidizing during densification, which oxidation causes stresses to accumulate, leading to the generation of manufactured devices leakage currents, densification is performed on the insulating layer 116 in a high-temperature nitrogen environment instead of in a high-temperature oxygen environment in which a denser insulating layer can be obtained. However, since the insulating layer 116 densified in a nitrogen environment has a looser structure and an etching rate higher than the patterned pad oxide layer 102a, and a factor of isotropic etching exists, pits 140 which can result in the kink effect are formed on the top corners 120 during wet etching using a hydrofluoric acid solution for removing the patterned pad oxide layer 102a, called a kink effect. The kink effect not only reduces threshold voltage, but also creates manufactured devices current leakage together with the formation of corner parasitic MOSFETs.

Additionally, during chemical mechanical polishing for planarizing the insulating layer 116 as shown in FIGS. 1D and 1E, particles in the polishing agent causes microscratches 150 on the surfaces of insulating layers 116a and 116b. The microscratches 150 becomes deeper and wider during wet etching using a hydrofluoric acid solution for removing the patterned pad oxide layer 102a, causing a bridging effect between the poly gates of two active regions on both sides of the isolation region 118a or 118b.

SUMMARY OF THE INVENTION

In view of the above, a first object of the invention is to provide a method of forming shallow trench isolation which can make the control of chemical mechanical polishing easier, thereby to improve the uniformity of chemical mechanical polishing and to prevent the dishing effect.

A second object of the invention is to provide a method of forming shallow trench isolation which can make an insulating layer in a trench denser, thereby protecting the top corners of the trench from the formation of pits. Thus, the kink effect is prevented, increasing the performances of manufactured devices.

A third object of the invention is to provide a method of forming shallow trench isolation which can prevent microscratches.

To achieve the above-stated objects, the method of forming shallow trench isolation includes the following steps. First, a pad oxide layer, a first mask layer and a second mask layer having openings therein are formed on a substrate. Trenches are formed in the substrate by etching using the second mask layer as an etching mask. Then, a liner oxide layer is formed on the surfaces of the trenches by thermal oxidation. At the same time, protective oxide layers are formed on the exposed edges of the first mask. A buffer layer is formed over the substrate. Thereafter, an insulating layer is formed on the buffer layer, and completely fills the trenches. Next, the insulating layer is planarized by chemical mechanical polishing to form a remaining insulating layer which still covers the buffer layer. Part of the remaining insulating layer, part of the buffer layer and the second mask layer are removed by etch back. Subsequently, the first mask layer, the protective oxide layer and the pad oxide layer are removed in order.

Furthermore, the second mask layer can be omitted. In this case, the etching of STI is implemented by using a photoresist as an etching mask.

BRIEF DESCRIPTION OF THE DRAWINGS

The invention will become more fully understood from the detailed description given hereinbelow and the accompanying drawings which are given by way of illustration only, and thus do not limit the present invention, and wherein.

DETAILED DESCRIPTION OF THE PREFERRED EMBODIMENTS

FIGS. 2A to 2F are schematic, cross-sectional views showing a method of forming shallow trench isolation according to a preferred embodiment of the invention.

Figure 1A:
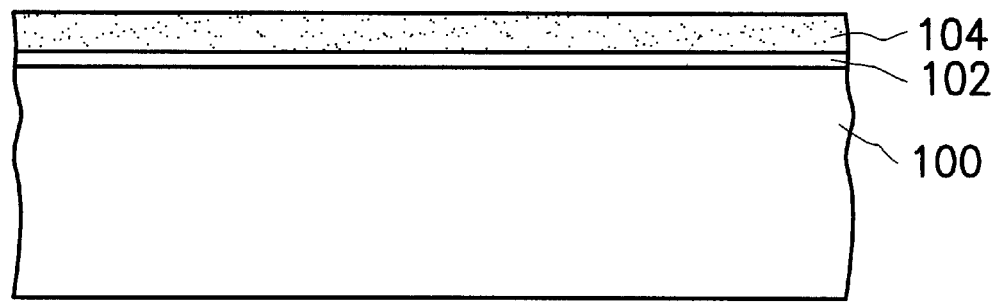
FIGS. 1A to 1E are schematic, cross-sections views showing a method of forming shallow trench isolation according to the prior art.
Figure 1B:
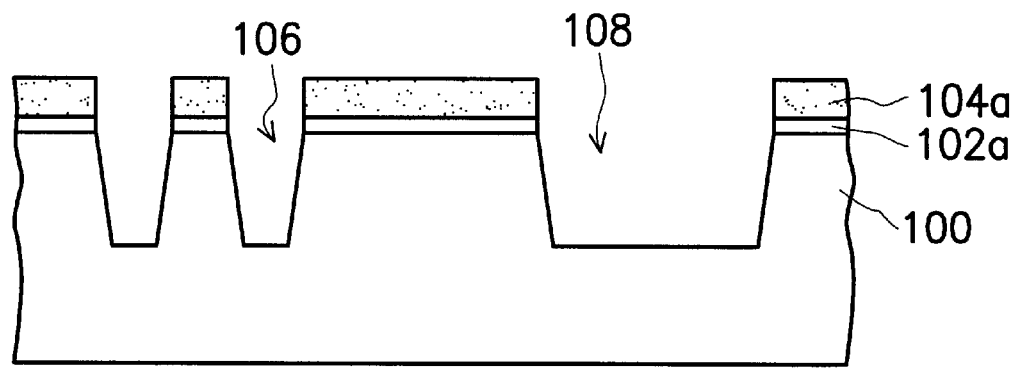
Figure 1C:
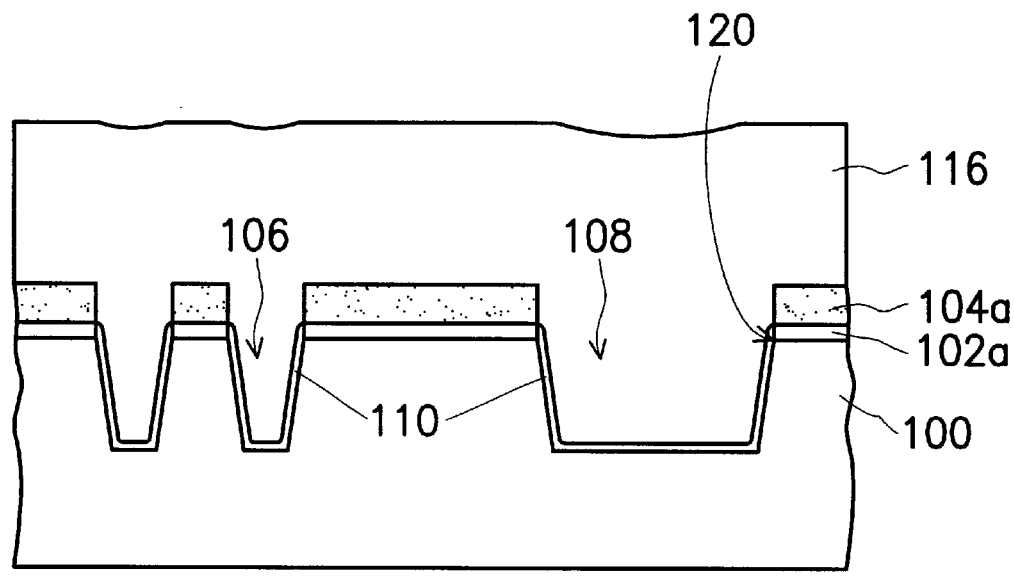
Figure 1D:
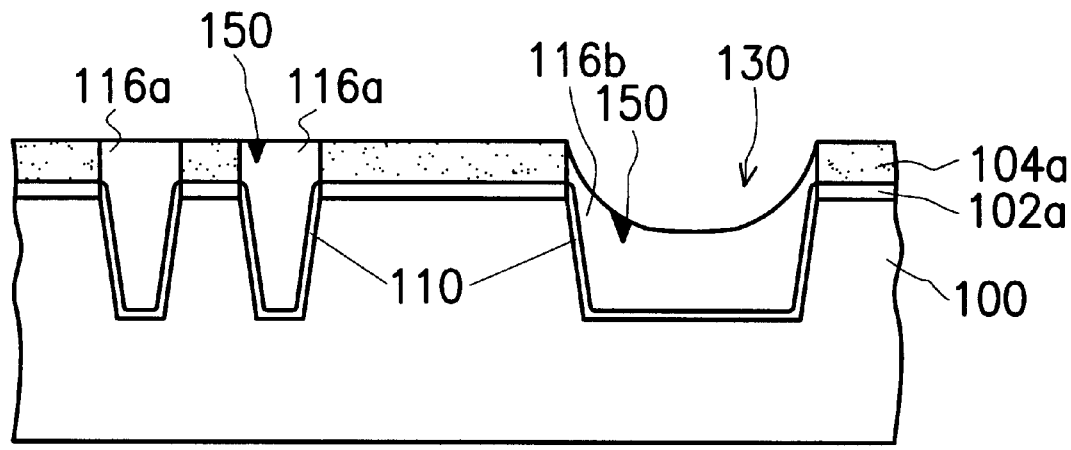
Figure 1E:
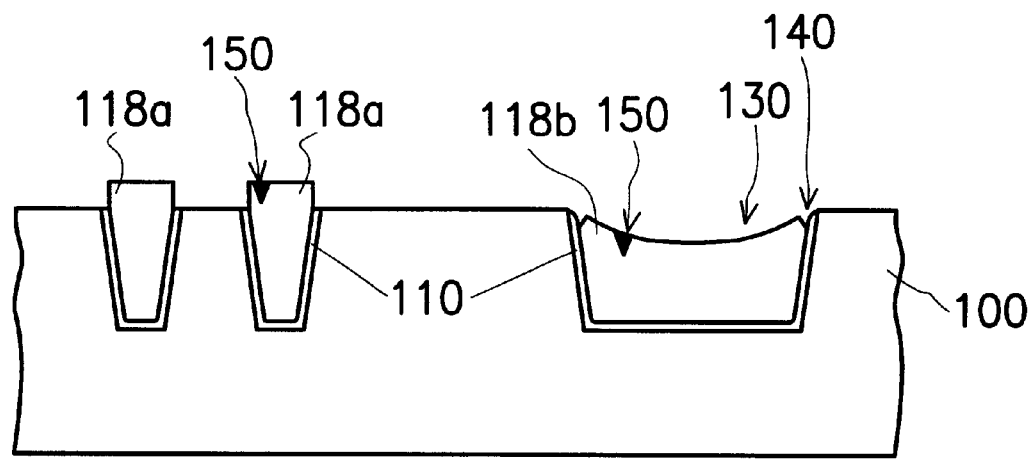
Figure 2A:
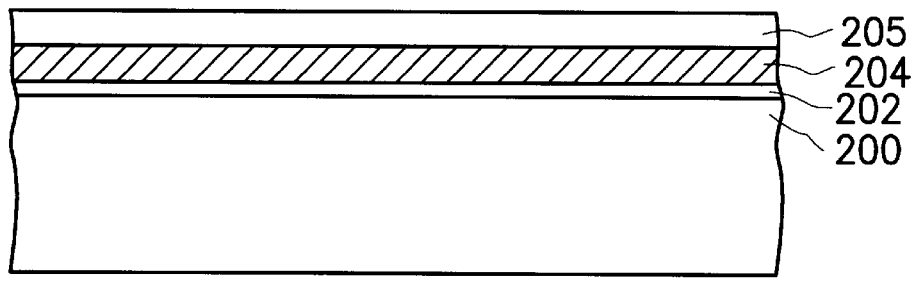
FIGS. 2A to 2F are schematic, cross-sectional views showing a method of forming shallow trench isolation according to a preferred embodiment of the invention.

Referring now to FIG. 2A, a pad oxide layer 202 is formed on a provided substrate 200, such as a P-type silicon substrate by, for example, thermal oxidation, for protecting the surface thereof. Then, a first mask layer 204, such as a polysilicon layer, and a second mask layer 205, such as a silicon oxide layer, are formed on the pad oxide layer 202 in order by, for example, low pressure chemical vapor deposition. Furthermore, the first mask 204, the second mask 205 and the substrate 200 have different etching rates.

Figure 2B:
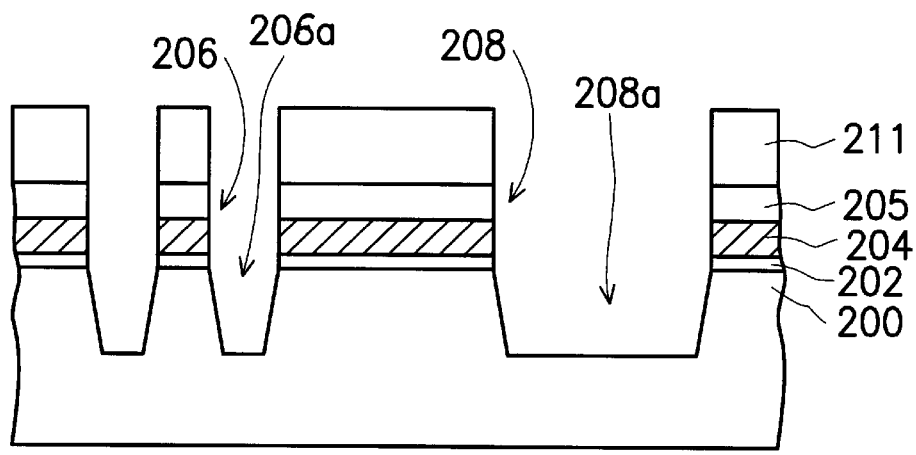

Referring to FIG. 2B, a patterned photoresist 211 is formed on the second mask layer 205 by photolithography and etching. Next, the first mask layer 204, the second mask layer 205 and the pad oxide layer 202 are patterned together into a remaining first mask layer 204a, a remaining second mask layer 205a and a remaining pad oxide layer 202a, thereby forming openings 206 and 208. The patterned photoresist is removed. Thereafter, trenches 206a and 208a are formed in the substrate 200 by anisotropic etching, such as dry plasma etching, using the remaining second mask layer 205a as a hard mask.

Figure 2C:
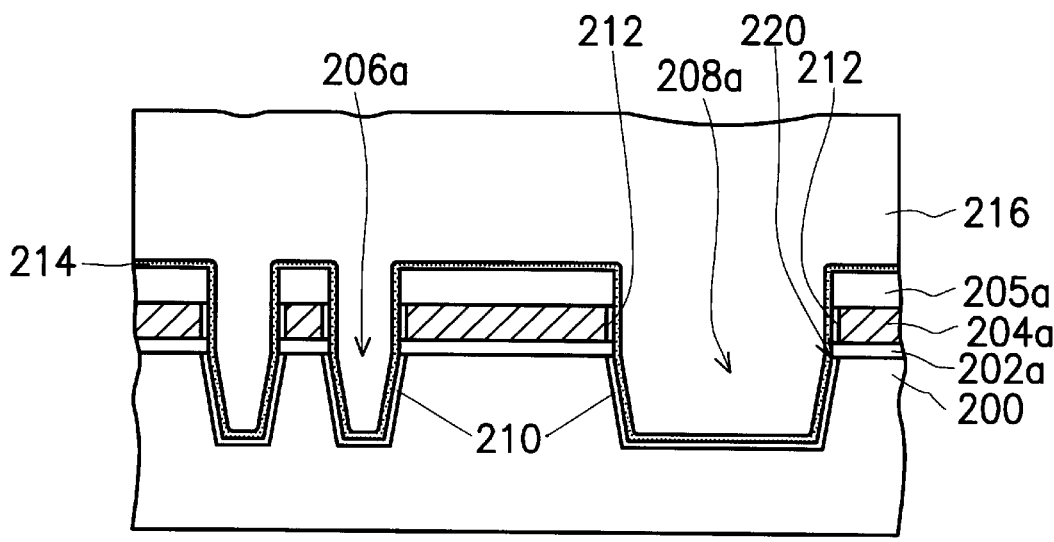

Referring to FIG. 2C, a liner oxide layer 210 is formed on the surfaces of the trenches 206a and 208a by oxidation, such as high-temperature thermal oxidation. At the same time, the exposed edges of the remaining first mask layer 204a are oxidized into protective oxide layer 212 which can prevent the formation of pits on the top corners 220 of the trenches 206a and 208a during subsequent etching as result of lateral etching. Afterwards, a buffer layer 214 is formed over the substrate 200. An insulating layer 216, such as a silicon oxide layer, is formed on the buffer layer 214 by, for example, atmospheric pressure chemical vapor deposition using TEOS as a reaction gas, and completely fills the trenches 206a and 208a. Then, densification is performed by heating the insulating layer 216 in an oxygen-containing environment at a high temperature of approximately 1,000° C. for 10–30 minutes. As is known, the insulating layer 216 becomes denser by densification in an oxygen-containing environment that in a nitrogen-containing environment. Therefore, the insulating layer 216 densified in an oxygen-containing environment can further enhance insulation efficacy. Moreover, during densification, the buffer layer 214 between the substrate 200 and the insulating layer 216 can block oxygen from diffusing, thereby preventing the sidewalls of the trenches 206a and 208a from oxidizing.

Figure 2D:
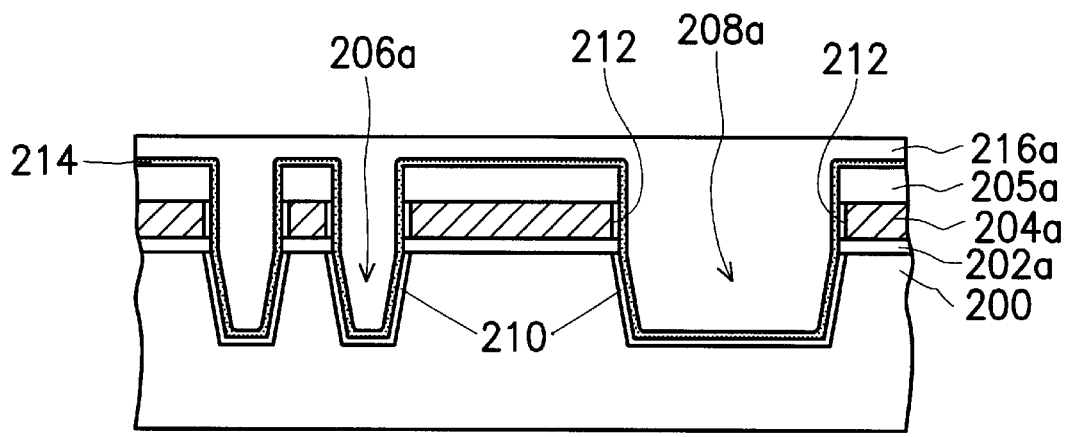

Referring to FIG. 2D, part of the insulating layer 216 is removed by chemical mechanical polishing (CMP) for global planarization. After that, a planarized insulating layer 216a still remains to cover the buffer layer 214.

Figure 2E:
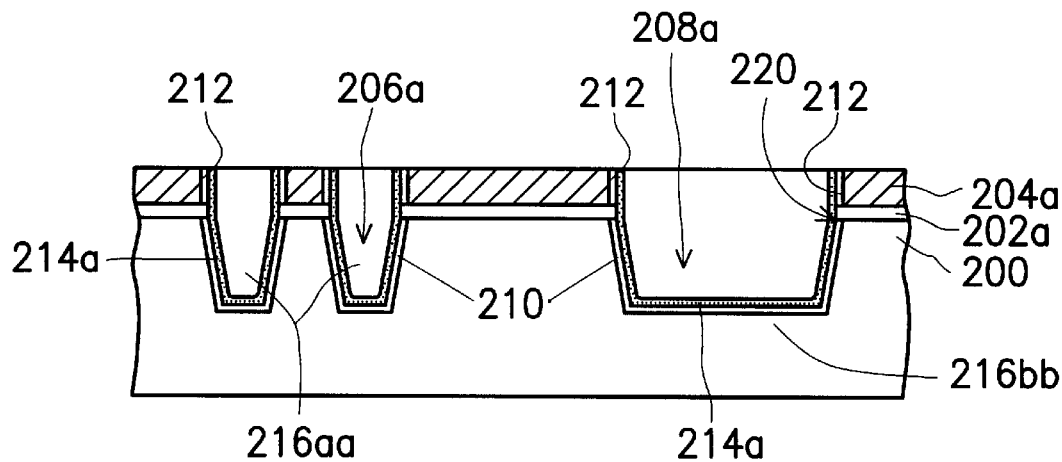

Referring to FIG. 2E, part of the remaining insulating layer 216a, part of the buffer layer 214 and the remaining second mask layer 205a are etched to form a remaining buffer layer 214a which still covers the protective oxide layer 212, the remaining pad oxide layer 202a and the liner oxide layer 210, by using the remaining first mask layer 204a as an etching stop layer. Moreover, remaining insulating layers 216aa and 216bb are formed in the trench 206a and 208a, respectively. For example, the remaining insulating layer 216a and the remaining second mask layer 205a are made of silicon oxide while the buffer layer 214 is made of silicon nitride, and the remaining first mask layer 204a is made of polysilicon. In this case, reaction ion etch (RIE) with a higher selective etching ratio of oxide to polysilicon and a lower selective etching ratio of oxide to silicon nitride is used to perform etch back for the step of FIG. 2E.

Figure 2F:
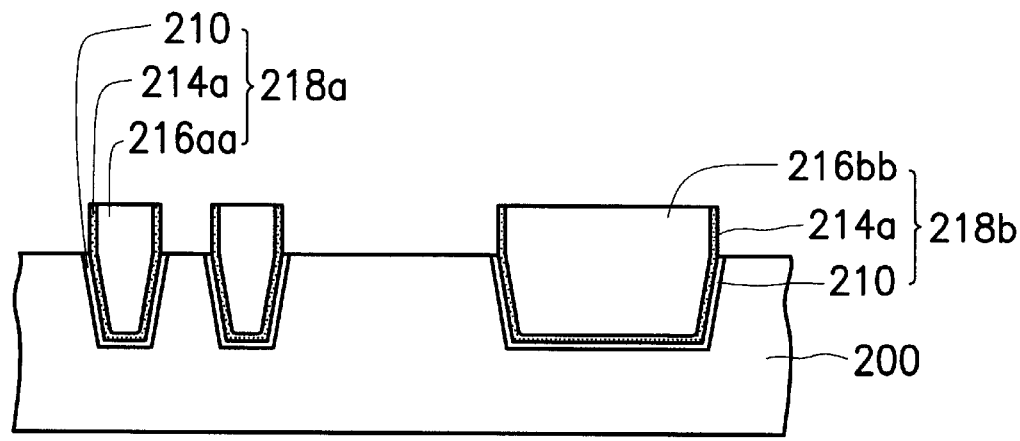

Referring to FIG. 2F, the remaining first mask layer 204a and the remaining pad oxide layer 202a are removed in order to form isolation regions 218a and 218b consisting of the remaining insulation layers 216aa, 216bb, the remaining buffer layer 214a and the liner oxide layer 210 in the trenches 206a, 208a. For example, the remaining first mask layer 204a is removed by anisotropic etching, such as dry plasma etching, to expose the remaining pad oxide layer 202a; and then, the remaining pad oxide 202a is removed by isotropic etching, such as wet etching using a hydrofluoric acid solution, or anisotropic etching, such as dry plasma etching, to form the isolation regions 218a, 218b.

Since the remaining insulating layer 216a still remains to cover the buffer layer 214 after chemical mechanical polishing for planarization as shown in FIG. 2D, the remaining insulating layers 216aa and 216bb can be prevented from being scratched by polishing particles, and influence on the uniformity of chemical mechanical polishing caused by various pattern densities is greatly reduced.

On the other hand, after removing the remaining first mask layer 204a, the protective oxide layer 212 still remains over the top corners 220 of the trenches 206a, 208a. Therefore, during wet etching for removing the remaining pad oxide layer 202a, the protective oxide layer 212 can protect the top corners 202 from the formation of pits by enhanced isotropic etching. As a result, the kink effect is prevented from occurring. Additionally, the remaining buffer layer 214a not only prevents the sidewalls of the trenches 206a and 208a from oxidizing, but also avoid a damage caused by lateral etching. Thus, pits on the top corners 220 and kink effect can be efficiently prevented.

Optionally, the second mask layer 205 can be omitted. In this case, the etching of STI is implemented by maintaining and using the patterned photoresist 211 as an etching mask.

In summary, the method of forming shallow trench isolation in accordance with the invention has the following advantages:
 1. The kink effect is prevented.
 2. The uniformity of chemical mechanical polishing is efficiently controlled.

3. The dishing effect is prevented.

4. No microscratch is created.

5. An insulating layer formed in a trench is denser than that of the prior art.

6. The sidewalls of a trench are prevented from oxidizing during densification in an environment filled with oxygen.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming shallow trench isolation comprising the steps of:

providing a substrate;

forming a pad oxide layer on the substrate;

forming a first mask layer on the pad oxide layer;

forming a second mask layer on the first mask layer;

forming an opening in the second mask layer, the first mask layer and the pad oxide layer;

forming a trench in the substrate with the second mask layer serving as a hard mask;

forming a liner oxide layer on the surface of the trench and forming protective oxide layers on the edges of the first mask layer;

forming a buffer layer conformal to the substrate;

forming an insulating layer over the buffer layer, wherein the insulating layer completely fills the trench;

removing part of the insulating layer, leaving part thereof on the buffer layer;

removing part of the remaining insulating layer, part of the buffer layer, and the second mask layer;

removing the first mask layer; and removing the pad oxide layer.

2. The method of forming shallow trench isolation as defined in claim 1, wherein the first mask layer, the second mask layer and the pad oxide layer have different etching rates.

3. The method of forming shallow trench isolation as defined in claim 2, wherein the first mask layer comprises a polysilicon layer.

4. The method of forming shallow trench isolation as defined in claim 3, wherein the step of removing the first mask layer is performed by anisotropic etching.

5. The method of forming shallow trench isolation as defined in claim 4, wherein the step of removing the first mask layer is performed by dry plasma etching.

6. The method of forming shallow trench isolation as defined in claim 2, wherein the second mask layer comprises a silicon oxide layer.

7. The method of forming shallow trench isolation as defined in claim 1, wherein the buffer layer has an etching rate different from that of the pad oxide layer, and can prevent the sidewalls of the trench from oxidizing.

8. The method of forming shallow trench isolation as defined in claim 7, wherein the buffer layer comprises a silicon nitride layer.

9. The method of forming shallow trench isolation as defined in claim 1, wherein the insulating layer comprises a silicon oxide layer.

10. The method of forming shallow trench isolation as defined in claim 1, wherein the step of removing parts of the insulating layer is performed by chemical mechanical polishing.

11. The method of forming shallow trench isolation as defined in claim 10, wherein the etch back comprises reaction ion etch (RIE).

12. The method of forming shallow trench isolation as defined in claim 1, wherein the step of removing the pad oxide layer is performed by anisotropic etching.

13. A method of forming shallow trench isolation comprising the steps of:

providing a substrate;

forming a pad oxide layer on the substrate;

forming a mask layer on the pad oxide layer;

forming a trench in the substrate through the mask layer and the pad oxide layer;

forming a liner oxide layer on the surface of the trench in the substrate and forming protective oxide layers on the edges of the mask layer;

forming a buffer layer conformal to the substrate;

forming an insulating layer over the buffer layer, wherein the insulating layer completely fills the trench;

removing part of the insulating layer, leaving part thereof on the buffer layer;

removing part of the remaining insulating layer and part of the buffer layer;

removing the mask layer; and removing the pad oxide layer.

14. The method of forming shallow trench isolation as defined in claim 13, wherein the mask layer and the pad oxide layer have different etching rates.

15. The method of forming shallow trench isolation as defined in claim 14, wherein the mask layer comprises a polysilicon layer.

16. The method of forming shallow trench isolation as defined in claim 15, wherein the step of removing the mask layer is performed by anisotropic etching.

17. The method of forming shallow trench isolation as defined in claim 16, wherein the step of removing the mask layer is performed by dry plasma etching.

18. The method of forming shallow trench isolation as defined in claim 13, wherein the buffer layer has an etching rate different from that of the pad oxide layer, and can prevent the sidewalls of the trench from oxidizing.

19. The method of forming shallow trench isolation as defined in claim 18, wherein the buffer layer comprises a silicon nitride layer.

20. The method of forming shallow trench isolation as defined in claim 13, wherein the insulating layer comprises a silicon oxide layer.

21. The method of forming shallow trench isolation as defined in claim 13, wherein the step of removing part of the insulating layer is performed by chemical mechanical polishing.

22. The method of forming shallow trench isolation as defined in claim 21, wherein the etch back comprises reaction ion etch (RIE).

23. The method of forming shallow trench isolation as defined in claim 13, wherein the step of removing the pad oxide layer is performed by anisotropic etching.

24. The method of forming shallow trench isolation as defined in claim 1, wherein the step of removing part of the remaining insulating layer, part of the buffer layer, and the second mask layer is performed by etching back using the first mask layer as an etching stop layer.

25. The method of forming shallow trench isolation as defined in claim 13, wherein the step of removing part of the remaining insulating layer and the buffer layer is performed by etching back using the mask layer as an etching stop layer.

26. A method of forming shallow trench isolation comprising the steps of:

provyiding a substrate;

forming a pad oxide layer on the substrate;

forming a polysilicon layer on the pad oxide layer;

forming an oxide layer on the polysilicon layer;

forming a trench in the substrate with the oxide layer serving as a hard mask;

forming a liner oxide layer on the surface of the trench in the substrate and forming protective oxide layers on the edges of the mask layer;

forming a nitride buffer layer conformal to the substrate;

forming an insulating layer over the buffer layer, wherein the insulating layer completely fills the trench;

removing part of the insulating layer, leaving part thereof on the buffer layer;

etching part of the remaining insulating layer, part of the buffer layer, and the oxide layer by using the polysilicon layer as an etching stop layer;

removing the polysilicon layer; and removing the pad oxide layer.

* * * * *